United States Patent
Park et al.

(10) Patent No.: US 10,014,455 B2
(45) Date of Patent: Jul. 3, 2018

(54) CHIP SUBSTRATE COMPRISING CAVITY WITH CURVED SURFACES

(71) Applicant: Point Engineering Co., Ltd., Asan-si (KR)

(72) Inventors: Seung Ho Park, Hwaseong-si (KR);
Tae Hwan Song, Cheonan-si (KR);
Sung Hyun Byun, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/866,073

(22) Filed: Sep. 25, 2015

(65) Prior Publication Data

US 2016/0095222 A1   Mar. 31, 2016

(30) Foreign Application Priority Data

Sep. 30, 2014   (KR) .................. 10-2014-0131806

(51) Int. Cl.
*H01L 33/62*   (2010.01)
*H05K 1/05*   (2006.01)
(Continued)

(52) U.S. Cl.
CPC .............. *H01L 33/62* (2013.01); *H01L 33/60* (2013.01); *H05K 1/05* (2013.01); *H05K 1/185* (2013.01);
(Continued)

(58) Field of Classification Search
CPC ......... H01L 33/00; H01L 33/48; H01L 33/50; H01L 33/52; H01L 33/54; H01L 33/60; H01L 33/62; H01L 21/00
(Continued)

(56) References Cited

U.S. PATENT DOCUMENTS 6,054,716 A * 4/2000 Sonobe ................ H01L 25/167
                                                              250/552
6,355,946 B1 * 3/2002 Ishinaga ............... H01L 33/486
                                                              257/100
(Continued)

FOREIGN PATENT DOCUMENTS

JP      10-242526 A   9/1998   ............. H01L 33/58
JP    2002-252372 A   9/2002   ............. H01L 33/00
(Continued)

OTHER PUBLICATIONS

Office Action—Application No. 10-2014-0131806, dated Sep. 17, 2015, 4 pages.
(Continued)

*Primary Examiner* — Xiaoliang Chen
(74) *Attorney, Agent, or Firm* — Sunstein Kann Murphy & Timbers LLP

(57) ABSTRACT

A chip substrate includes conductive portions, an insulation portion and a cavity. The conductive portions are laminated in one direction to constitute the chip substrate. The insulation portion is interposed between the conductive portions to electrically isolate the conductive portions. The cavity is formed on an upper surface of the chip substrate at a predetermined depth in a region including the insulation portion. The cavity is defined by a plurality of continuously-extending curved surfaces having predetermined radii of curvature.

1 Claim, 3 Drawing Sheets

(51) Int. Cl.
*H05K 1/18* (2006.01)
*H01L 33/60* (2010.01)
*H01L 33/48* (2010.01)

(52) U.S. Cl.
CPC .. *H01L 33/486* (2013.01); *H05K 2201/09745* (2013.01); *H05K 2201/10106* (2013.01)

(58) Field of Classification Search
USPC ......... 174/255; 257/88, 98, 99, 705; 313/46; 362/84, 311.02, 612, 619
See application file for complete search history.

(56) References Cited

U.S. PATENT DOCUMENTS

| | | | | |
|---|---|---|---|---|
| 7,728,341 | B2* | 6/2010 | Mazzochette | F21K 9/00 257/98 |
| 8,746,932 | B2 | 6/2014 | Ide et al. | 362/297 |
| 2003/0057111 | A1* | 3/2003 | Ichikawa | B65D 77/2032 206/5.1 |
| 2003/0098459 | A1* | 5/2003 | Horiuchi | H01L 33/486 257/81 |
| 2003/0102481 | A1* | 6/2003 | Isoda | H01L 33/486 257/79 |
| 2004/0007770 | A1 | 1/2004 | Kurihara | 257/685 |
| 2004/0016873 | A1* | 1/2004 | Kida | H01L 31/0203 250/214 R |
| 2004/0150335 | A1* | 8/2004 | Horiuchi | H01L 33/486 313/512 |
| 2005/0072981 | A1* | 4/2005 | Suenaga | H01L 33/486 257/88 |
| 2005/0135453 | A1* | 6/2005 | Kneissl | B82Y 20/00 372/94 |
| 2005/0179130 | A1* | 8/2005 | Tanaka | H01L 21/0237 257/730 |
| 2006/0291245 | A1* | 12/2006 | Shimada | F21K 9/00 362/612 |
| 2008/0073709 | A1* | 3/2008 | Fujimoto | H01L 27/10823 257/334 |
| 2009/0046470 | A1* | 2/2009 | Lai | G02B 6/0021 362/311.01 |
| 2009/0091020 | A1* | 4/2009 | Wei | H01L 21/4807 257/705 |
| 2009/0095967 | A1* | 4/2009 | Masui | H01L 33/52 257/98 |
| 2009/0129119 | A1* | 5/2009 | Lee | B29C 33/3842 362/619 |
| 2010/0072499 | A1* | 3/2010 | Kwon | H01L 33/483 257/98 |
| 2010/0187546 | A1* | 7/2010 | Fushimi | H01L 33/62 257/88 |
| 2011/0062473 | A1* | 3/2011 | Tanuma | H01L 33/486 257/98 |
| 2011/0089453 | A1* | 4/2011 | Min | F21V 5/04 257/98 |
| 2011/0241028 | A1* | 10/2011 | Park | H01L 33/486 257/88 |
| 2012/0018772 | A1* | 1/2012 | Nishijima | H01L 33/486 257/99 |
| 2012/0126269 | A1 | 5/2012 | Tanuma | 257/98 |
| 2013/0011617 | A1* | 1/2013 | Tasaki | B29C 45/14 428/148 |
| 2013/0026529 | A1 | 1/2013 | Tsang | 257/99 |
| 2013/0193560 | A1* | 8/2013 | Usui | G03F 9/7007 257/618 |
| 2013/0334559 | A1* | 12/2013 | Vdovin | H01L 33/507 257/98 |
| 2014/0084322 | A1* | 3/2014 | Park | H01L 33/486 257/98 |
| 2014/0124812 | A1* | 5/2014 | Kuramoto | H01L 24/97 257/98 |
| 2014/0126222 | A1* | 5/2014 | Wang | F21V 5/043 362/311.09 |
| 2014/0204591 | A1* | 7/2014 | Kim | G02B 19/0061 362/311.02 |
| 2014/0300267 | A1* | 10/2014 | Oh | H01L 33/60 313/46 |
| 2014/0367718 | A1* | 12/2014 | Park | H01L 33/486 257/98 |
| 2015/0001573 | A1* | 1/2015 | Park | H01L 33/483 257/99 |
| 2015/0009649 | A1* | 1/2015 | Jagt | H01L 33/507 362/84 |
| 2016/0005931 | A1 | 1/2016 | Lee et al. | H01L 33/486 |
| 2016/0095222 | A1 | 3/2016 | Park et al. | 174/255 |
| 2016/0380167 | A1 | 12/2016 | Ahn et al. | H01L 33/58 |

FOREIGN PATENT DOCUMENTS

| | | | | |
|---|---|---|---|---|
| JP | 3158232 U | 3/2010 | ............ | H01L 33/64 |
| JP | 2011-91344 A | 5/2011 | ............ | H01L 33/48 |
| KR | 10-2010-0054457 | 5/2010 | ............ | H01K 33/48 |
| KR | 10-0986211 | 10/2010 | ............ | H05K 1/18 |
| KR | 10-2010-0122655 | 11/2010 | ............ | H01L 33/50 |
| KR | 10-2011-0055401 A | 5/2011 | ............ | H01L 33/48 |
| KR | 10-2014-0108172 | 9/2014 | ............ | H01L 33/30 |

OTHER PUBLICATIONS

Office Action—Application No. 10-2014-0131806, dated Sep. 17, 2015, 2 pages (English translation of main parts only).

* cited by examiner

CHIP SUBSTRATE COMPRISING CAVITY WITH CURVED SURFACES

CROSS-REFERENCE TO RELATED PATENT APPLICATION

This U.S. non-provisional patent application claims priority under 35 U.S.C. § 119 of Korean Patent Application No. 10-2014-0131806 filed on Sep. 30, 2014 in the Korean Patent Office, the entire contents of which are hereby incorporated by reference.

BACKGROUND

1. Technical Field

The present invention relates to an unprocessed chip plate and a chip substrate; and, more particularly, to an unprocessed chip plate and a chip substrate including a cavity for mounting a chip.

2. Description of Related Art

In the related art, spaces for mounting chips to an unprocessed chip plate are formed on the upper surface of the unprocessed chip plate by mechanical processing or chemical etching. That is to say, Korean Patent No. 10-0986211 discloses a method in which mounting spaces are formed by etching an upper portion of an unprocessed rectangular metal plate. In the case where optical element chips such as UV LEDs or the like are mounted on such an unprocessed chip plate, spaces having a wide-top/narrow-bottom shape are formed in the unprocessed chip plate in order to enhance the light reflection performance. After forming the spaces, chips are mounted within the spaces. The spaces are sealed by lenses in order to enhance the light efficiency.

Korean Patent Application Publication No. 10-2010-0122655 discloses a method in which the illuminance in a central portion is increased by forming a hemispherical dome-shaped lens and in which a phosphor contained in a resin material is uniformly dispersed so as to maintain a uniform density and to suppress color unevenness. However, the hemispherical lens disclosed in Korean Patent Application Publication No. 10-2010-0122655 has a problem in that a difficulty is involved in processing the lens.

SUMMARY

In view of the above technical problem, it is advantageous to provide a chip substrate capable of increasing the illuminance in a central portion by using a planar lens.

More specifically, it is advantageous to provide a chip substrate capable of, even when a planar lens is used, increasing the illuminance in a central portion by forming a cavity defined by a plurality of curved surfaces.

In accordance with one aspect of the present invention, there is provided a chip substrate, including: conductive portions laminated in one direction to constitute the chip substrate; an insulation portion interposed between the conductive portions to electrically isolate the conductive portions; and a cavity formed on an upper surface of the chip substrate at a predetermined depth in a region including the insulation portion, wherein the cavity is defined by a plurality of continuously-extending curved surfaces having predetermined radii of curvature.

In the chip substrate, the cavity may be defined by at least one curved surface having a radius of positive curvature and at least one curved surface having a radius of negative curvature.

In the chip substrate, the curved surfaces may have a shape symmetrical with respect to a chip to be mounted on the chip substrate.

The chip substrate may further include: an auxiliary groove which is contiguous to the cavity and which is formed in a smaller area and a smaller depth than the cavity.

In the chip substrate, the cavity may include a central portion formed into a planar surface.

An optical element chip package having high illuminance in a central portion thereof may be realized through the use of an easy-to-process planar lens. As compared with a case where a hemispherical lens is used, it is possible to reduce the thickness of a chip package. This makes it possible to reduce the thickness of a device to which the chip package is applied.

DETAILED DESCRIPTION OF THE EMBODIMENTS

The following disclosure merely illustrates the principle of the invention. While not explicitly described or illustrated in the subject specification, in view of the principle of the invention, one of ordinary skill in the art may make different devices realizing the principle of the invention and falling within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, a chip substrate will be described in detail with reference to the accompanying drawings. For the sake of convenience, descriptions will be made by taking an LED as an example of a chip.

In the present embodiment, in order to manufacture an unprocessed chip plate, conductive portions 110 having a predetermined thickness and made of an electrically conductive material and insulation portion(s) 120 made of an insulating material are bonded to each other and alternately laminated with the insulation portion 120 interposed between the conductive portions 110.

By heating and pressing the conductive portions 110 and the insulation portion(s) 120 in laminated state, it is possible to manufacture a conductive material lump within which the insulation portions 120 are spaced apart with each other in parallel. The manufacture of an unprocessed chip plate is completed by vertically cutting the conductive material lump. In the present embodiment, one direction is a vertical direction. The unprocessed chip plate 10 is manufactured by vertically cutting the conductive material lump along a lamination direction.

A chip substrate according to the present embodiment is manufactured by forming a cavity, which is defined by a plurality of curved surfaces, on the unprocessed chip plate manufactured by the aforementioned method. The cavity may be formed on the conductive material lump or may be formed on the unprocessed chip plate.

A chip substrate including a cavity defined by a plurality of curved surfaces according to one embodiment of the present invention will now be described with reference to FIG. 1.

Figure 1:
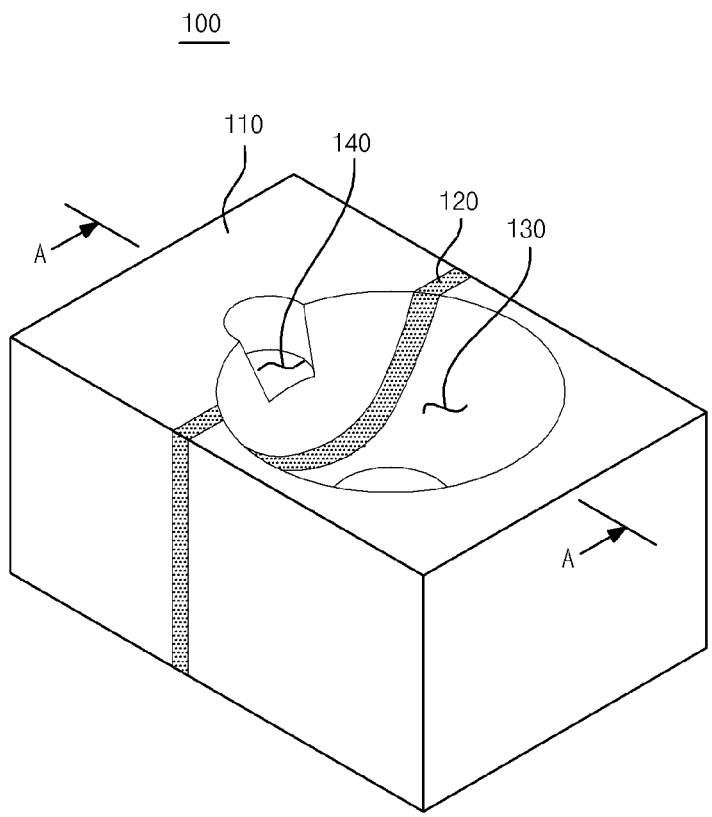
FIG. 1 is a perspective view illustrating a chip substrate including a cavity defined by a plurality of curved surfaces according to one embodiment of the present invention.

FIG. 1 is a perspective view illustrating a chip substrate including a cavity defined by a plurality of curved surfaces ac cording to one embodiment of the present invention.

Referring to FIG. 1, the chip substrate 100 according to the present embodiment includes conductive portions 110, an insulation portion 120 and a cavity 130.

That is to say, the cavity 130 defined by a plurality of curved surfaces is formed on the chip substrate 100 having a rectangular shape when the chip substrate 100 is seen from above. In this case, the cavity 130 is formed so as to include the insulation portion 120.

Figure 2:
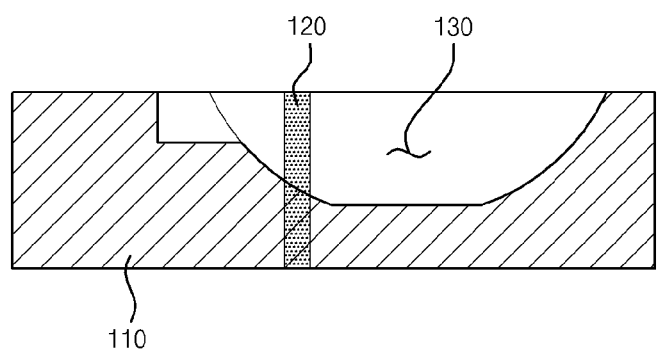
FIG. 2 is a top view of the chip substrate including a hemispherical cavity according to one embodiment of the present invention.

In the present embodiment, the conductive portions 110 are laminated in one direction, thereby constituting the chip substrate 100. The conductive portions 110 serve as electrodes which apply a voltage to a chip mounted in a subsequent process. The term "one direction" used herein means a lamination direction in which conductive portions and insulation portions are alternately laminated in the aforementioned laminating process. In FIG. 2, one direction is a horizontal direction.

The insulation portion 120 is interposed between the conductive portions 110 to electrically isolate the conductive portions 110. That is to say, the conductive portions 110 insulated by the insulation portion 120 interposed between the conductive portions 110 may serve as a positive electrode terminal and a negative electrode terminal.

In the present embodiment, there is described an example in which one insulation portion 120 exists between two conductive portions 110. Alternatively, the chip substrate 100 may be configured by alternately laminating three or more conductive portions and two or more insulation portion. A larger number of insulation portions may be formed depending on the use of the chip substrate 100.

In the chip substrate 100 according to the present embodiment, the cavity 130 is formed in a region which includes the insulation portion 120.

Referring to FIG. 2, the cavity 130 may be formed in a substantially hemispherical shape having a plurality of curved surfaces.

In the present embodiment, the cavity 130 may be defined by a continuous surface formed of a plurality of curved surfaces having predetermined radii of curvature. That is to say, the surface of the cavity 130 may be defined by a free-form surface.

Specifically, as illustrated in FIGS. 3A to 3D, the cavity 130 may defined by a combination of curved surfaces having predetermined radii of curvature.

In the case where a chip is mounted within the cavity 130, the emission pattern of the light emitted from the chip and reflected by the cavity 130 may vary depending on the position and height of the mounted chip.

Furthermore, the emission pattern of the light may be changed depending on the structure of a chip or the use of a chip package having a chip mounted thereon.

In order realize a desired light emission pattern, a chip substrate 100 on which a chip is to be mounted is configured by defining the cavity 130 with a plurality of curved surfaces.

Figure 3A:
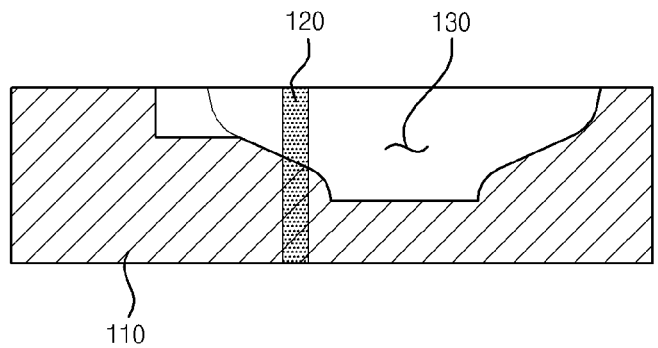
FIGS. 3A to 3D, 4A and 4B are sectional views of chip substrates including different hemispherical cavities according to one embodiment of the present invention.

As illustrated in FIG. 3A, the cavity 130 may be defined by a first convex curved surface having a radius of positive curvature and a second concave curved surface having a radius of negative curvature, the second concave curved surface disposed above the first convex curved surface.

Figure 3B:
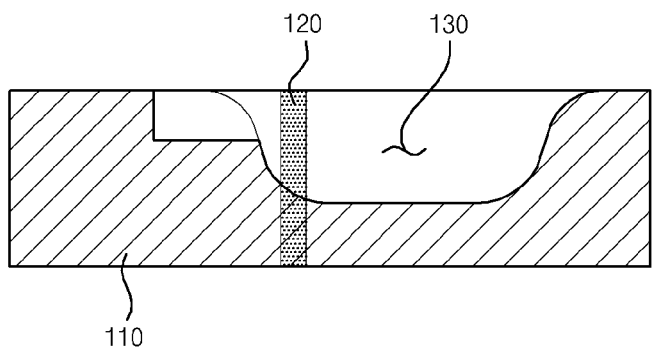
Figure 3C:
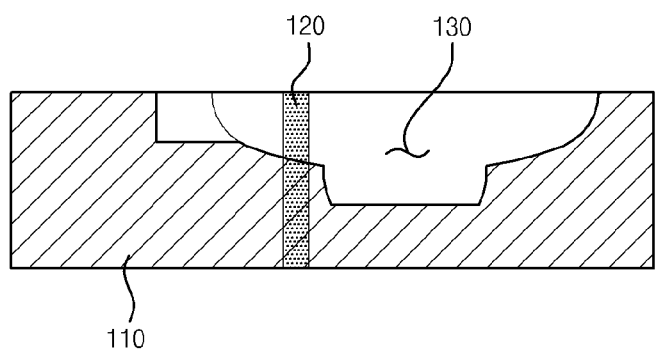

Conversely, as illustrated in FIG. 3C, the cavity 130 may be defined by a first concave curved surface having a radius of negative curvature and a second convex curved surface having a radius of positive curvature, the second convex curved surface disposed above the first concave curved surface.

Figure 3D:
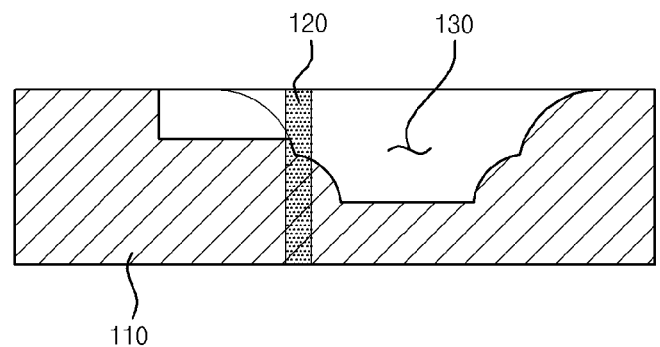

Furthermore, as illustrated in FIGS. 3B and 3D, the cavity 130 may be defined by first and second curved surfaces which are curved in the same direction but differ in radius of curvature.

In FIGS. 3A to 3D, there are illustrated examples in which the cavity 130 is symmetrically defined by the curved surfaces symmetrical with respect to a chip mounting position in a direction perpendicular to the insulation portion 120. However, depending on the use of a chip package, the cavity 130 may be asymmetrically defined by curved surfaces asymmetrical with respect to a chip mounting position as illustrated in FIGS. 4A and 4B.

Figure 4A:
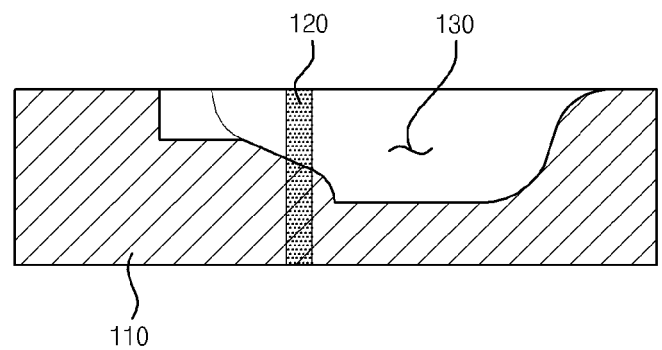
Figure 4B:
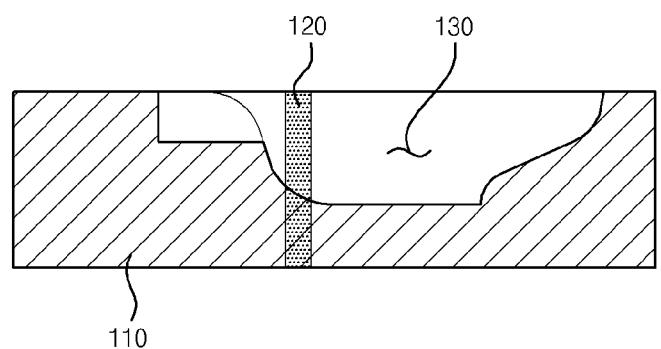

In the asymmetrical cavity 130, as illustrated in FIGS. 4A and 4B, one side of the first curved surface has a radius of negative curvature and the other side of the first curved surface has a radius of positive curvature. Alternatively, one side of the first curved surface and the other side of the first curved surface may differ in radius of curvature from each other.

In the aforementioned embodiment, the cavity 130 is defined by a continuous surface formed of a combination of first curved surface and a second curved surface disposed in the vertical direction. Alternatively, the cavity 130 may be divided into a plurality of regions and may be defined by a plurality of curved surfaces having predetermined radii of curvature disposed in the horizontal direction.

In the present embodiment, the cavity 130 is configured to enhance the light reflection performance in the desired direction depending on the position and kind of a mounted chip and the use thereof and is capable of increasing the brightness by focusing light on one point.

Furthermore, the cavity 130 includes a central portion preferably formed into a circular flat surface. That is to say, the cavity 130 may include a flat surface so that a chip can be mounted within the cavity 130 without being inclined with respect to the chip substrate 100.

Referring again to FIG. 1, the chip substrate 100 including the cavity 130 defined by a plurality of curved surfaces according to the present embodiment may further include an auxiliary groove 140. That is to say, in the present embodiment, the auxiliary groove 140 is contiguous to the surface of the cavity 130 and is formed in a smaller area and a smaller depth than the cavity 130.

Specifically, referring to FIG. 1, the auxiliary groove 140 is formed at a depth smaller than that of the cavity 130 and is contiguous to the surface of the cavity 130. Furthermore, the auxiliary groove 140 has a planar bottom surface.

Accordingly, in the case where a chip is mounted within the cavity 130 and the electrode portion of the chip is electrically connected to the conductive portions 110 by wire bonding, one end of a wire is bonded to the electrode portion and the other end of the wire is easily bonded to the planar bottom surface of the auxiliary groove 140.

In the present embodiment, the cross-sectional shape of the auxiliary groove 140 is circular. However, depending on the design choice, the cross-sectional shape of the auxiliary groove 140 may be changed to a rectangular shape, an elliptical shape or other shapes. Furthermore, the depth of the auxiliary groove 140 is set such that the brightness increase in the hemispherical cavity 130 is not hindered.

Furthermore, there is illustrated an example in which only one cavity 130 is formed. However, depending on the usage of the chip substrate 100, it may be possible to form a plurality of cavities. For example, four cavities may be formed. In this case, two insulation portions may be disposed.

As described above, an optical element chip package exhibiting a high illuminance in a central portion may be realized by using an easy-to-process planar lens rather than a hemispherical lens so that a phosphor is uniformly dispersed in a resin material. Furthermore, the thickness of the chip package may be reduced as compared with a case where a hemispherical lens is used. This makes it possible to reduce the thickness of a device to which the chip package is applied.

While not shown in the drawings, when packaging an optical element chip using the chip substrate 100 according to the aforementioned embodiment, the optical element chip is mounted on one of the conductive portions 110 within the cavity 130 having a hemispherical concave shape. The optical element chip is wire-bonded to the bottom surface of the auxiliary groove 140.

That is to say, the application of voltages to the optical element chip may be realized through the wire bonding or the bonding to the conductive portions 110. It goes without saying that the voltage application method may be differently changed depending on the structure of a mounted chip.

The forgoing descriptions are mere illustration of the technical concept of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A chip substrate, comprising:

conductive portions;

an insulation portion interposed between the conductive portions to electrically isolate the conductive portions from each other; and a cavity formed on an upper surface of the chip substrate at a predetermined depth in a region including at least a part of the insulation portion, wherein the cavity is defined by a plurality of continuously-extending curved surfaces having predetermined radii of curvature and a shape symmetrical with respect to a chip to be mounted on the chip substrate, and includes a central portion formed into a planar surface, and the plurality of continuously-extending curved surfaces include a first smoothly curved surface and a second smoothly curved surface smoothly extending from the first curved surface, the first and the second curved surface being edgeless, wherein one of the first and the second curved surface is concave-up and the other of the first and the second curved surface is concave-down, wherein the conductive portions having a predetermined thickness and made of an electrically conductive material and the insulation portion made of an insulating material are bonded to each other in parallel surface, and the insulation portion is in the continuously-extending curved surfaces, and wherein the cavity further includes an auxiliary groove which is formed in a smaller area and a smaller depth than the cavity and is contiguous to the surface of the cavity in one of the conductive portions and has a planar bottom surface so that one end of a wire is bonded to the electrode portion of an optical element chip and the other end of the wire is bonded to the planar bottom surface of the auxiliary groove when the optical element chip is mounted within the cavity in the other of the conductive portion.

\* \* \* \* \*